United States Patent [19]
Ando

[11] Patent Number: 5,192,986
[45] Date of Patent: Mar. 9, 1993

[54] HETEROJUNCTION FIELD EFFECT TRANSISTOR EQUIPPED WITH ELECTROSTATIC LENS FOR IMPROVING BALLISTIC PROPAGATION

[75] Inventor: Yuji Ando, Tokyo, Japan
[73] Assignee: Nec Corporation, Tokyo, Japan
[21] Appl. No.: 757,297
[22] Filed: Sep. 10, 1991

[30] Foreign Application Priority Data
Sep. 17, 1990 [JP] Japan ................ 2-246598

[51] Int. Cl.$^5$ ............... H01L 29/80; H01L 29/48; H01L 29/161
[52] U.S. Cl. .................... 257/192; 257/270; 257/280
[58] Field of Search .......... 357/22 A, 22 MD, 22 I, 357/22 G, 22 S, 16, 15

[56] References Cited

U.S. PATENT DOCUMENTS
4,962,410 10/1990 Kriman et al. .............. 357/15

FOREIGN PATENT DOCUMENTS
3-198382 8/1991 Japan ................... 357/22

OTHER PUBLICATIONS
Electron Focusing in Two-Dimensional Systems by Means of an Electrostatic Lens, Appl. Phys. Lett. 56(13), Mar. 26, 1990, pp. 1290-1292, by J. Spector, et al.

Primary Examiner—Andrew J. James
Assistant Examiner—Ngan Van Ngo
Attorney, Agent, or Firm—Burns, Doane, Swecker & Mathis

[57] ABSTRACT

An heterojunction field effect transistor comprises a channel forming layer associated with a carrier supplying layer, and an electrostatic lens is provided across the channel forming layer with a focusing gate electrode appropriately biased, wherein an abrupt potential discontinuity is produced in the bottom edge of the conduction band of the channel forming layer with an emitter gate electrode provided between a source electrode and the focusing gate electrode so that hot electrons produced by the abrupt potential discontinuity have substantially uniform longitudinal electron energies allowing the hot electrons to be focused upon a focal point of the electrostatic lens.

24 Claims, 7 Drawing Sheets

HETEROJUNCTION FIELD EFFECT TRANSISTOR EQUIPPED WITH ELECTROSTATIC LENS FOR IMPROVING BALLISTIC PROPAGATION

FIELD OF THE INVENTION

This invention relates to a heterojunction field effect transistor and, more particularly, to an electrostatic lens provided between source and drain electrodes for improving ballistic electron propagation.

DESCRIPTION OF THE RELATED ART

An heterostructure equipped with an electrostatic lens is disclosed by J. Spector et. al. in "Electron focusing in two-dimensional system by means of an electrostatic lens", Applied Physics Letters, vol. 56, No. 13, pages 1290 to 1292, Mar. 26, 1990. FIG. 1 shows a typical example of the heterostructure proposed by Spector et. al., and is fabricated on a semi-insulating substrate 1 of gallium arsenide. On the semi-insulating substrate 1 is grown a high-purity undoped gallium arsenide film 2 which is overlain by an intentionally undoped aluminum gallium arsenide film 3a. A silicon film 4 is sandwiched between the intentionally undoped aluminum gallium arsenide film 3a and another intentionally undoped aluminum gallium arsenide film 3b, and is substantially as thin as a single silicon atom.

On the intentionally undoped aluminum gallium arsenide film 3b are provided ohmic electrodes 5a and 5b at spacing between which three Schottky electrodes 6a, 6b and 6c are held in contact with the unintentionally undoped aluminum gallium arsenide film 3b. The Schottky electrode 6a splits into two halves, and the two halves converge toward the Schottky electrode 6b. However, the leading edges are slightly spaced apart from each other, and a gap 7a is formed therebetween. Similarly, the Schottky electrode 6b splits into two halves, however, the two halves of the Schottky electrode 6b diverge toward the ohmic electrode 5b. The two halves of the Schottky electrode 6b are spaced apart at the leading ends thereof so that a gap 7b is formed therebetween The Schottky electrodes 6a and 6b thus arranged allow electrons to pass therethrough at that portions beneath the gaps 7a and 7b in the presence of an appropriate biasing state, and, accordingly, form point contacts. The Schottky electrode 6c is constricted at the intermediate portion thereof, and the side surfaces of the intermediate portion draw arches. Therefore, semi-circular hollow spaces 7c and 7d are partially defined by the side surfaces of the intermediate portion of the Schottky electrode 6c, and are confronted to the gaps 7a and 7b, respectively. The constricted intermediate portion of the Schottky electrode 6c forms an electrostatic lens as will be described hereinbelow.

If an appropriate negative biasing voltage Vfg is applied to the Schottky electrode 6c, electron density is decreased in that area beneath the Schottky electrode 6c. In general, when electrons are injected from a high electron density area into a low electron density area, the longitudinal electron energy only decreases the component perpendicular to the boundary therebetween due to the law of energy conservation as well as the law of conservation of momentum. This results in refraction of electron. In other words, the low electron density area can be analogous to a medium with an index of optical refraction n'0 less than unity with respect to the high electron density area serving as a medium with the index of optical refraction n. The index of refraction for electron is hereinbelow referred to as "index of electron refraction". The index of electron refraction is given as a ratio of Fermi wave number in the low electron density area to Fermi wave number in a peripheral area. The electron density and, accordingly, the Fermi wave number in the area beneath the Schottky electrode 6c is varied together with the biasing voltage level Vfg applied thereto, and, for this reason, the index of electron refraction is variable with the biasing voltage level Vfg. It will be understood by the analogy between the optical refraction and the electron refraction that the arched side surfaces of the Schottky electrode 6c form an electrostatic lens for electrons in the intentionally undoped aluminum gallium arsenide film 3b. The radius of curvature r of the arched side surfaces and the index of electron refraction determine the focal distance f of the electrostatic lens, and the focal distance f is varied with the biasing voltage level.

In operation, appropriate biasing voltage levels Veg and Vdg are respectively applied to the Schottky electrodes 6a and 6b so that the intentionally undoped aluminum gallium arsenide film is depleted below the split Schottky electrodes 6a and 6b. However, the intentionally undoped aluminum gallium arsenide film 3b exposed to the gaps 7a and 7b are hardly depleted, and the point contacts Q1 and Q2 are formed thereat. If the ohmic electrode 5b is positively biased with respect to the ohmic electrode 5a, the electrons diverge from the point contact Q1 to the side surface defining the semicircular hollow space 7c. The electrostatic lens produced beneath the Schottky electrode 6c inwardly refracts the flow of electrons. If the focal distance f is matched with distance L as shown in FIG. 2, the flow of electrons is focused upon the point contact Q2 as indicated by dash lines. This means that the biasing voltage level Vfg is adjusted in such a manner as to cause the focal distance f to be equal to the distance L. As a result, current at the ohmic electrode 5b shows negative resistance with respect to the biasing voltage level Vfg.

The electrostatic lens thus incorporated in the prior art heterostructure can focus electrons emitted from the point contact Q1 upon the point contact Q2 when the focal distance f is adjusted to the distance L. However, a problem is encountered in that the prior art heterostructure allows an extremely small amount of current to flow between the point contacts Q1 and Q2. In detail, the conductance G at a point contact is generally given as $$G = \frac{e^2}{\pi \hbar} N \qquad \text{Equation 1}$$

where e is charge of an electron, $\pi$ is the ratio of the circumference of a circle to its diameter, $\hbar$ is the reduced Planck's constant, and N is the number of subbands occupied by electrons. N is usually a natural number from 1 to tens. On the other hand, it is necessary for a large amount of current passing between the point contacts Q1 and Q2 to increase the channel width and, accordingly, N. However, if N is increased, the point contact Q1 does not behave as a point light source, and the electron current is hardly focused upon the point contact Q2 under the condition of f=L. This means that the prior art heterostructure is responsive to the biasing voltage level Vfg in so far as the channel width remains narrow. In other words, the prior art heterostructure can control a small amount of current with the biasing voltage level Vfg. In fact, Spector et. al. reported that only 100 nano-ampere flowed between the point contacts, and the prior art heterostructure hardly achieves acceptable amplification. Since Equation 1 is fabricated from universal constants except for N, a new aspect is required so as to make the heterostructure become feasible.

SUMMARY OF THE INVENTION

It is therefore an important object of the present invention to provide a heterojunction field effect transistor which can control a large amount of current with an electrostatic lens.

To accomplish the object, the present invention proposes to form an abrupt potential discontinuity instead of point contact. In detail, the applicant noticed that point contacts on both side of an electrostatic lens were causative of a small amount of current, and made research and development efforts to find means for allowing an electrostatic lens to focus electrons upon a point instead of point contacts. In order to focus electrons injected into an electrostatic lens upon a point, it is necessary to make the longitudinal electron energies, and a potential barrier provided in front of the electrostatic lens makes the longitudinal electron energies. In other words, the potential barrier perpendicular to a center axis of the electrostatic lens produces hot electrons with substantially uniform longitidinal electron energies, and the hot electrons are incident onto the electrostatic lens in a direction perpendicular thereto. Then, the hot electrons are focused upon a point.

In accordance with the present invention, there is provided a heterojunction field effect transistor fabricated on a semi-insulating substrate, comprising: a) an epitaxial structure having a channel forming layer of a first compound semiconductor material and a carrier supplying layer of a second compound semiconductor material; b) source and drain electrodes provided on the epitaxial structure at spacing, and held in contact with the epitaxial structure in an ohmic manner; c) a focusing gate electrode formed on the epitaxial structure between the source and drain electrodes, and operative to form an electrostatic lens in the channel forming layer of the epitaxial structure, a focal distance of the electrostatic lens being variable depending upon a biasing voltage level at the focusing gate electrode; d) an emitter gate electrode formed on the epitaxial structure between the source electrode and the focusing gate electrode, and operative to produce an abrupt potential discontinuity in the bottom edge of the conduction band of the first compound semiconductor material for producing hot carriers; and e) a detecting gate electrode formed on the epitaxial structure between the focusing gate electrode and the drain electrode, and spaced apart from the emitter gate electrode by a predetermined distance equal to or less than a mean free path of carriers in the channel forming layer, the amount of the carriers passing through the detecting gate electrode to the drain electrode being varied depending upon the focal distance.

BRIEF DESCRIPTION OF THE DRAWINGS

The features and advantages of the heterojunction field effect transistor according to the present invention will be more clearly understood from the following description taken in conjunction with the accompanying drawings in which.

DESCRIPTION OF THE PREFERRED EMBODIMENTS

First Embodiment

Figure 1:
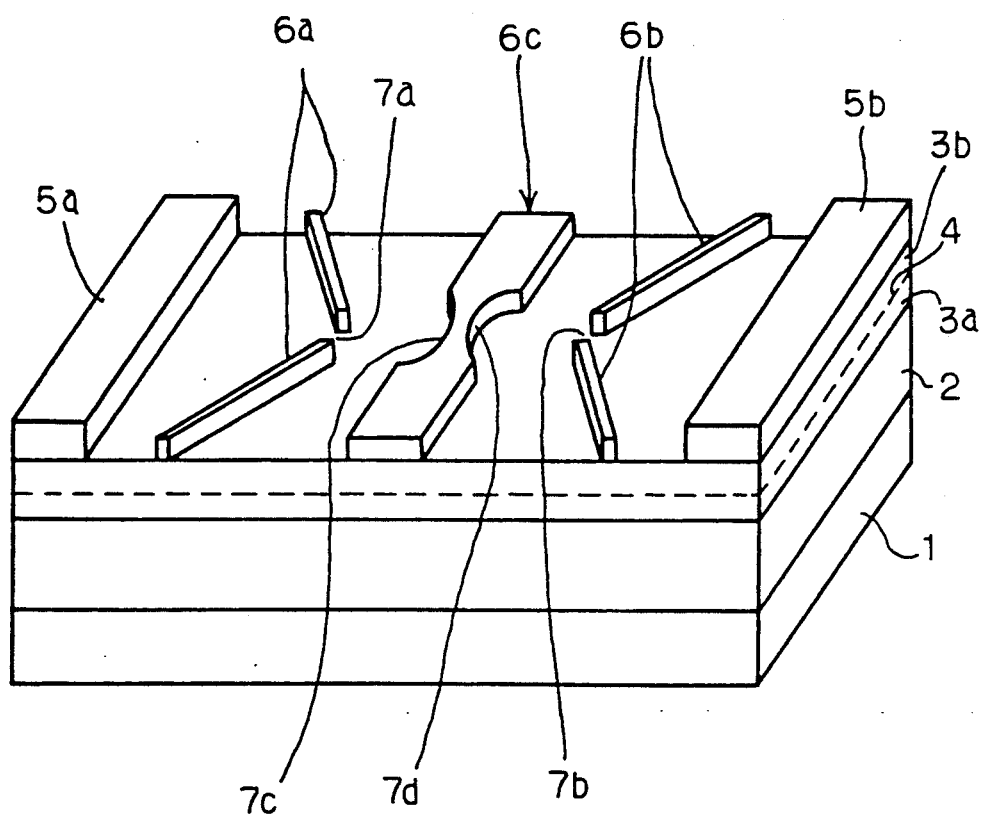
FIG. 1 is a perspective view showing the structure of the prior art heterojunction field effect transistor with the electrostatic lens associated with two point contacts.
Figure 2:
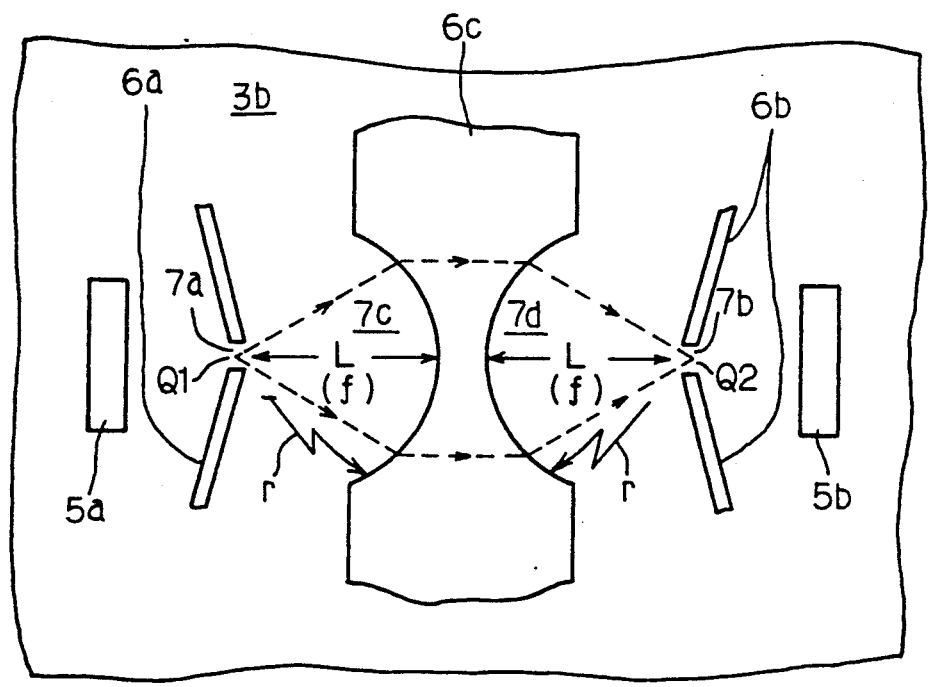
FIG. 2 is a plan view showing the arrangement of the electrodes provided in the prior art heterojunction field effect transistor.
Figure 3:
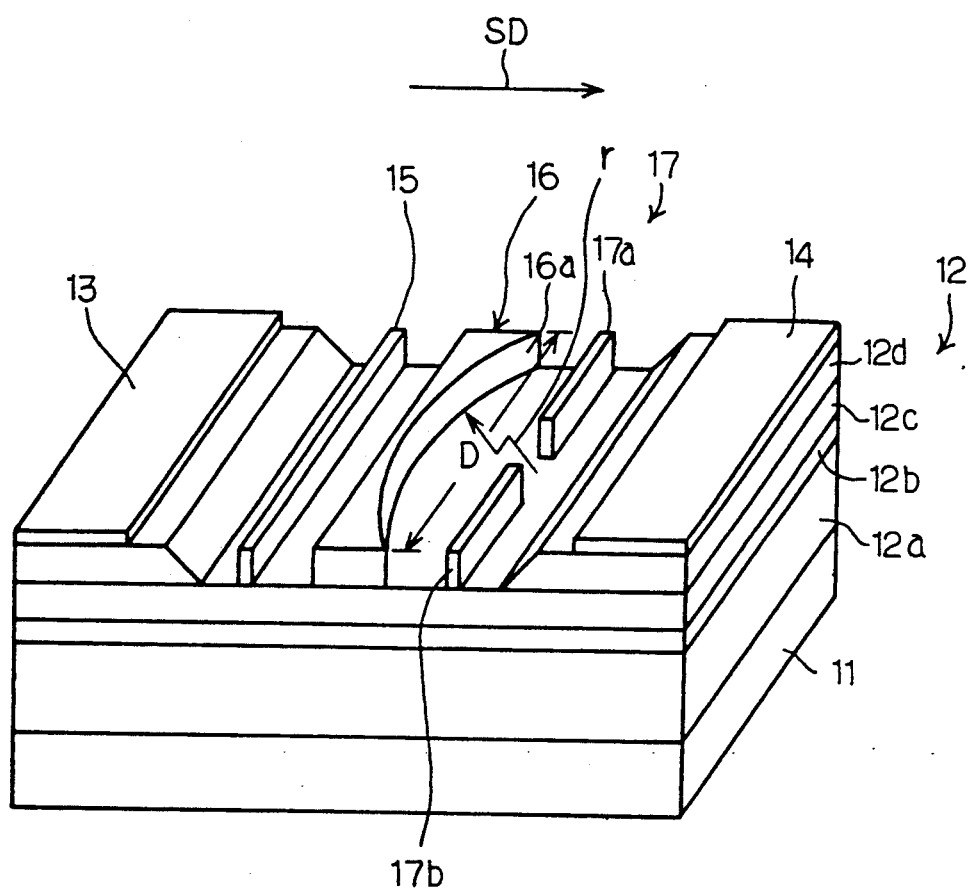
FIG. 3 is a perspective view showing the structure of a heterojunction field effect transistor with an electrostatic lens according to the present invention.

Referring to FIG. 3 of the drawings, a heterojunction field effect transistor embodying the present invention is fabricated on a semi-insulating substrate 11 of gallium arsenide. The heterojunction field effect transistor shown in FIG. 3 largely comprises an epitaxial structure 12 grown on the semi-insulating substrate 11, source and drain electrodes 13 and 14, and emitter gate electrode 15, a focusing gate electrode 16, and a detecting gate electrode 17. The epitaxial structure 12 comprises a channel forming layer 12a grown on the semi-insulating substrate 11, a spacer layer 12b formed on the channel forming layer 12a and a carrier supplying layer 12c formed on the spacer layer 12b, and the channel forming layer 12a, the spacer layer 12b and the carrier supplying layer 12c are respectively formed of an intentionally undoped gallium arsenide film of about 2000 angstroms, an intentionally undoped aluminum gallium arsenide film of about 500 angstroms and an n-type aluminum gallium arsenide film of about 300 angstroms. A conductive channel takes place in the channel forming layer 12a in the vicinity of the spacer layer 12b, and provides the means fee path of electron as long as 10 microns. The intentionally undoped aluminum gallium arsenide film is represented by the molecular formula of $Al_{0.2}Ga_{0.8}As$, and the n-type aluminum gallium arsenide film is expressed by the same molecular formula. The n-type aluminum gallium arsenide film 12c is doped at about $3 \times 10^{18}/cm^3$. On the carrier supplying layer 12c is further grown an n-type gallium arsenide film 12d which has a thickness of about 300 angstroms. The n-type gallium arsenide film 12d is doped with n-type impurity atoms at about $5 \times 10^{18}/cm^3$, and is partially removed so as to form a recess exposing the n-type aluminum gallium arsenide film 12c. The n-type gallium arsenide film 12d serves as a cap layer, and the source and drain electrodes 13 and 14 are formed on the cap layer spaced apart by the recess.

The source and drain electrodes 13 and 14 form ohmic contacts to the n-type gallium arsenide film 12d, and the emitter gate electrode 15, the focusing gate electrode 16 and the detecting gate electrode 17 provide Schottky barriers against the n-type aluminum gallium arsenide film 12c. In a fabrication process, metal is evaporated so as to form a metal film, and the metal film is patterned by using lithographic process. The metal thus patterned is alloyed to form the source and drain electrodes 13 and 14. On the other hand, the emitter gate electrode 15, the focusing gate electrode 16 and the detecting gate electrode 17 are patterned by using an electron beam lithography.

The emitter gate electrode 15 and the detecting gate electrode 17 measure about 500 angstroms and about 0.1 micron in a source-to-drain direction SD, respectively, and the side surfaces of the emitter gate electrode 15 and the detecting gate electrode 17 are substantially perpendicular to the source-to-drain direction SD. The source-to-drain direction SD is indicative of a direction along which the source and drain electrodes 13 and 14 are spaced apart. The focusing gate electrode 16 has that arched side surface 16a with a radius of curvature r of about 10 micron which is confronted to the detecting gate electrode 17. Another side surface of the focusing gate electrode 16 is substantially in parallel to the side surfaces of the emitter gate electrodes 15. The detecting gate electrode 17 is split into two halves 17a and 17b, and the two halves 17a and 17b are spaced apart from each other by about 0.2 micron. The center axis of the gap between the two halves 17a and 17b is substantially aligned with an axis of symmetry of the arched side surface 16a, and the center axis and the axis of symmetry are assumed to be parallel to the source-to-drain direction SD. The distance between the emitter gate electrode 15 and the detecting gate electrode 17 is about 3 microns, and the detecting gate electrode 17 is spaced apart from the focusing gate electrode 16 along the axis of symmetry by about 2 microns. Both distances fall within the mean free path of electrons in the channel forming layer 12a.

When an appropriate biasing voltage level Vfg is applied to the focusing gate electrode 16, an electrostatic lens is formed in the channel forming layer 12a, and the detecting gate electrode 17 provides a conductive path below the gap between the two halves 17a and 17b under an appropriate biasing voltage level Vdg.

Figure 4:
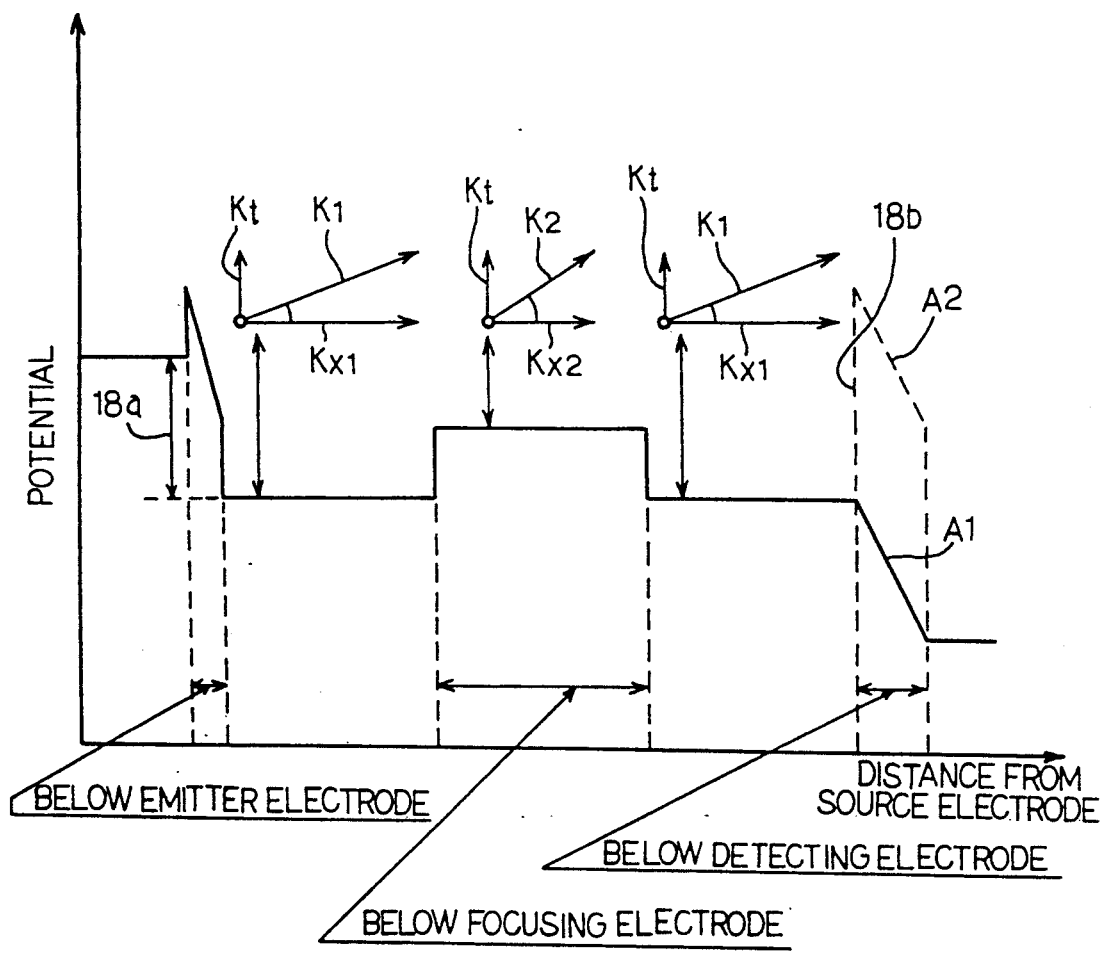
FIG. 4 is an energy band diagram showing the profile of the bottom edge of conduction band produced in the heterojunction field effect transistor.

FIG. 4 shows a profile of the bottom the conduction band produced in the channel forming layer 12a in a modeled form under application of a positive drain voltage level Vds with respect to a source voltage level, and oblique real line A1 is indicative of the bottom edge in the region below the gap between the two halves 17a and 17b. On the other hand, the dash lines A2 stand for the bottom edge produced below the two halves 17a and 17b. When an appropriate biasing voltage level Veg is applied to the emitter gate electrode 15, a depletion region below the emitter gate electrode 15 forms an abrupt potential discontinuity 18a, and the potential barrier 18a accelerates electrons. The electrons thus accelerated become hot electrons, and travel toward a region below the detecting electrode 17 in a ballistic manner. Since the distance between the emitter gate electrode 15 and the detecting gate electrode 17 is smaller than the mean free path of electrons, the hot electrons ballistically travel over the distance between the emitter gate electrode 15 and the detecting gate electrode 17. On the way to the region below the detecting gate electrode 17, the hot electrons go across a region below the focusing gate electrode 16, and the electrostatic lens produced below the focusing gate electrode 16 refracts the hot electrons. As described hereinbefore, the bottom edge A2 is produced below the two halves 17a and 17b, and provides a potential barrier 18b with respect to the bottom edge A1 below the gap. This is because of the fact that the region below the two halves 17a and 17b are depleted in the presence of the appropriate biasing voltage level Vdg to the detecting gate electrode 17, and the bottom edge A1 allows the hot electrons to pass through the detecting gate electrode 17. The region below the gap serves as a point contact, however, no point contact is formed between the source electrode 13 and the focusing gate electrode 16. The abrupt potential discontinuity 18a behaves as if it is of the point contact, and negative resistance characteristics are achieved by the heterojunction field effect transistor.

The appropriate biasing voltage level Vfg lifts the bottom edge of the conduction band with respect to the bottom edge on both side thereof. In general, when an electron is obliquely injected from a high kinetic energy region into a low kinetic energy region, the component of the longitudinal electron energy perpendicular to the interface therebetween is decreased from $k_{x1}$ to $k_{x2}$, i.e., $k_{x2} < k_{x1}$, however, the lateral component $k_t$ is conserved. The high kinetic energy region means a region of the channel forming layer where electrons possess a high kinetic energy rather than a low kinetic energy region. The incident angle Ai and the outgoing angle Ar are given by Equations 2 and 3.

$$\sin Ai = \frac{k_t}{\sqrt{k_{x1}^2 + k_t^2}} \qquad \text{Equation 2}$$

$$\sin Ar = \frac{k_t}{\sqrt{k_{x2}^2 + k_t^2}} \qquad \text{Equation 3}$$

The low kinetic energy region behaves as if it is a medium with the index of optical refraction n less than unity with respect to the high kinetic energy region n=1. The index of electron refraction n is given by Equation 4.

$$n = \frac{\sin Ai}{\sin Ar} = \frac{\sqrt{k_{x2}^2 + k_t^2}}{\sqrt{k_{x1}^2 + k_t^2}} = \sqrt{\frac{E_2}{E_1}} \qquad \text{Equation 4}$$

where $E_1$ is kinetic energy in the high kinetic energy region, and $E_2$ is kinetic energy in the low kinetic energy region. $E_1$ is larger than $E_2$. If the biasing voltage level Vfg is regulated in such a manner that the high kinetic energy region takes place on both sides of the low kinetic energy region below the focusing gate electrode 16, the focusing gate electrode 16 produces an electrostatic lens with the index of electron refraction of n.

In general, a focal distance f of a lens is given as $$\frac{1}{f} = (n-1)\left(\frac{1}{r1} - \frac{1}{r2} + \frac{(n-1)d}{n\,r1\,r2}\right) \qquad \text{Equation 5}$$

where r1 and r2 are radiuses of curvature of both side surfaces of the lens, d is the thickness of the lens, and n is the index of refraction. In this instance, r1 is infinity, and r2 is assumed to be r. Equation 5. is modified as $$f = \frac{r}{1-n} \qquad \text{Equation 6}$$

Equation 6 is applicable to a convex lens. If the biasing voltage level Vfg is changed, the kinetic energy $E_2$ below the focusing gate electrode 16 is modified, and the index of electron refraction n is controllable as will be understood from Equation 4. The focal distance f is varied with the index of electron refraction n (see Equation 6), and the high and low kinetic energy regions provide the electrostatic lens. Since the abrupt potential discontinuity 18a makes the longitudinal electron energies of electrons substantially uniform, any point contact is not necessary in front of the electrostatic lens.

Figure 5A:
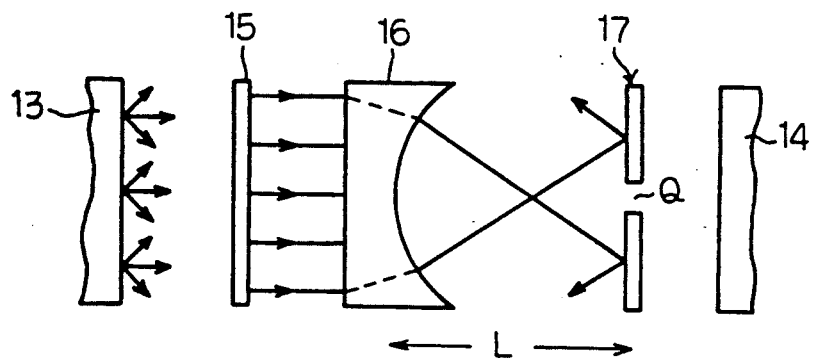
FIGS. 5A to 5C are plan views showing the behavior of the electrostatic lens incorporated in the heterojunction field effect transistor.
Figure 5B:
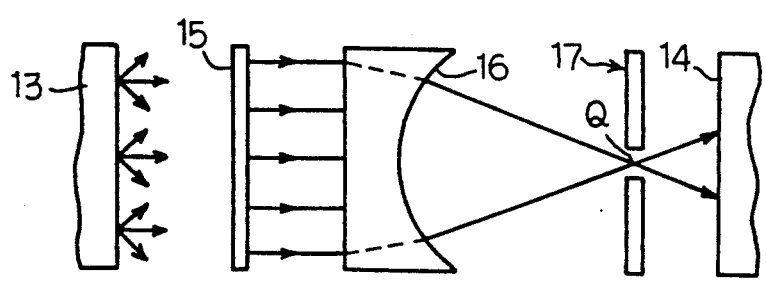
Figure 5C:
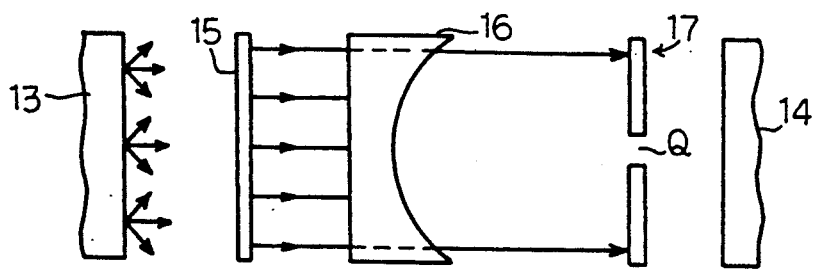

FIGS. 5A to 5C show behavior of the electrostatic lens incorporated in the heterojunction field effect transistor implementing the first embodiment, and L stands for the distance between the focusing gate electrode 16 and the detecting gate electrode 17. Assuming now the appropriate biasing voltage levels Veg and Vdg create the abrupt potential discontinuity 18a and the point contact Q below the emitter gate electrode 15 and the detecting gate electrode 17, respectively, the drain electrode 14 positively biased with respect to the source electrode 13 allows electrons to flow from the source electrode 13. The electrons radially diverge from the source electrode 13 due to heat distribution of velocity, and are accelerated at the abrupt potential discontinuity 18a. Then, the electrons become hot electrons with substantially uniform longitudinal electron energies, and the hot electrons are incident onto the electrostatic lens. The hot electrons with substantially uniform longitudinal electron energies are equivalent to a collimated electron wave, and, for this reason, are concentrated at the focus of the electrostatic lens.

The kinetic energy $E_2$ is varied together with the biasing voltage level Vfg, and the focal distance f is modulated as shown by Equations 4 and 6. If the biasing voltage level Vfg is around a pinch-off point, the electron kinetic energy $E_2$ below the focusing gate electrode 16 is low enough to satisfy $f < L$. In case of $n < n_c = 1 - r/L$ where $n_c$ is the critical index of electron refraction for concentrating electrons at the point contact Q, Equation 6 gives the relation between the focal distance f and the distance L, and the hot electrons are concentrated at a certain point between the focusing gate electrode 16 and the detecting gate electrode 17 as shown in FIG. 5A. This means that most of hot electrons can not pass through the point contact Q.

However, if the kinetic energy $E_2$ is increased together with the biasing voltage level Vfg, the index of electron refraction n of the low kinetic energy region below the focusing gate electrode 16 is approximately equal to the critical index of electron refraction $n_c$, the hot electrons are focused upon the point contact Q as shown in FIG. 5B, and all of the hot electrons reach the drain electrode 14.

Figure 6:
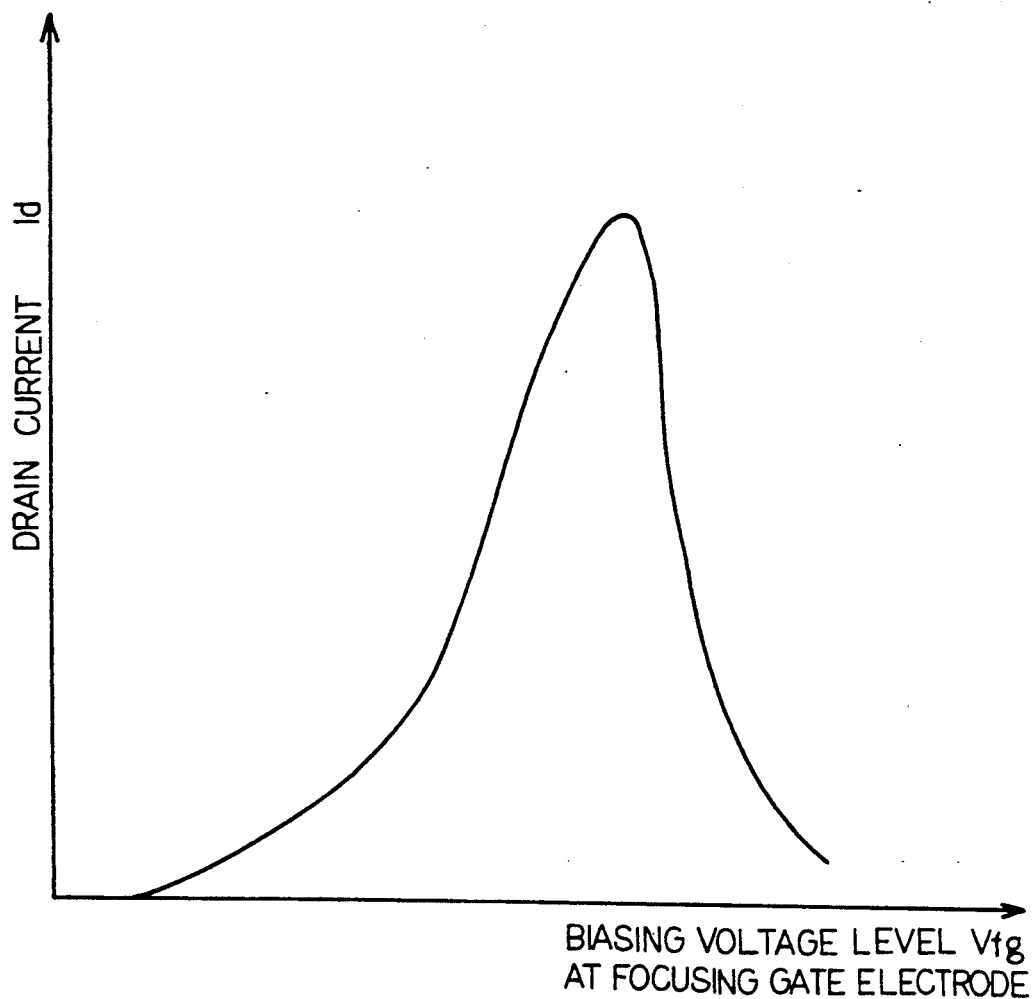
FIG. 6 is a graph showing the negative resistance characteristics between the drain current and the biasing voltage level at the focusing gate electrode.

If the biasing voltage level Vfg further increases the kinetic energy $E_2$, the kinetic energy $E_2$ becomes equal to the kinetic energy $E_1$, and any refraction takes place in the electrostatic lens as shown in FIG. 5C. This results in that most of the hot electrons can not reach the drain electrode 14. Thus, the maximum drain current takes place at $n = n_c$, and the drain current-to-focusing gate voltage Vfg is of the negative resistance characteristics as shown in FIG. 6.

As will be seen from FIG. 5B, the flow of hot electrons as wide as D approximately equal to 2r is gathered at the point contact Q, and the point contact Q merely discriminates and selects the hot electrons refracted by the electrostatic lens. Therefore, the gap between the two halves 17a and 17b is increasable in so far as the gap is sufficiently small rather than the distance D. This means that focusing characteristics are never deteriorated by increasing N of Equation 1. Therefore, the amount of drain current Id is substantially proportional to the distance D, and the drain current Id is never dominated by the universal constants. Since the radius of curvature r is not greater than the mean free path of electrons, the effective channel width or the distance D is maximized to the mean free path of electrons. The heterojunction field effect transistor implementing the first embodiment has a modulation doped structure, and the modulation doped structure can achieve an extremely large electron mobility. In fact it is possible to increase the mean free path of electrons to about 100 microns, and, accordingly, the effective channel width or the distance D can be increased to about 100 microns. A heterojunction field effect transistor with the effective channel width of 100 microns can control the drain current of the order of several milliamperes. Even if the radius of curvature r is as small as 1 micron, the drain current is more than ten times as large as the drain current of the prior art heterostructure.

As will be appreciated from the foregoing description, the heterojunction field effect transistor according to the present invention controls a large amount of drain current by virtue of an abrupt potential discontinuity produced between the source electrode and a focusing gate electrode, and can serve as an amplification element. In order to allow the electrostatic lens to focus electrons upon a certain point, it is necessary that most of the longitudinal electron energies are distributed within a range around 90% of a typical value, and the abrupt potential discontinuity of at least 0.3 eV achieves the acceptable uniformity.

Second Embodiment

Figure 7:
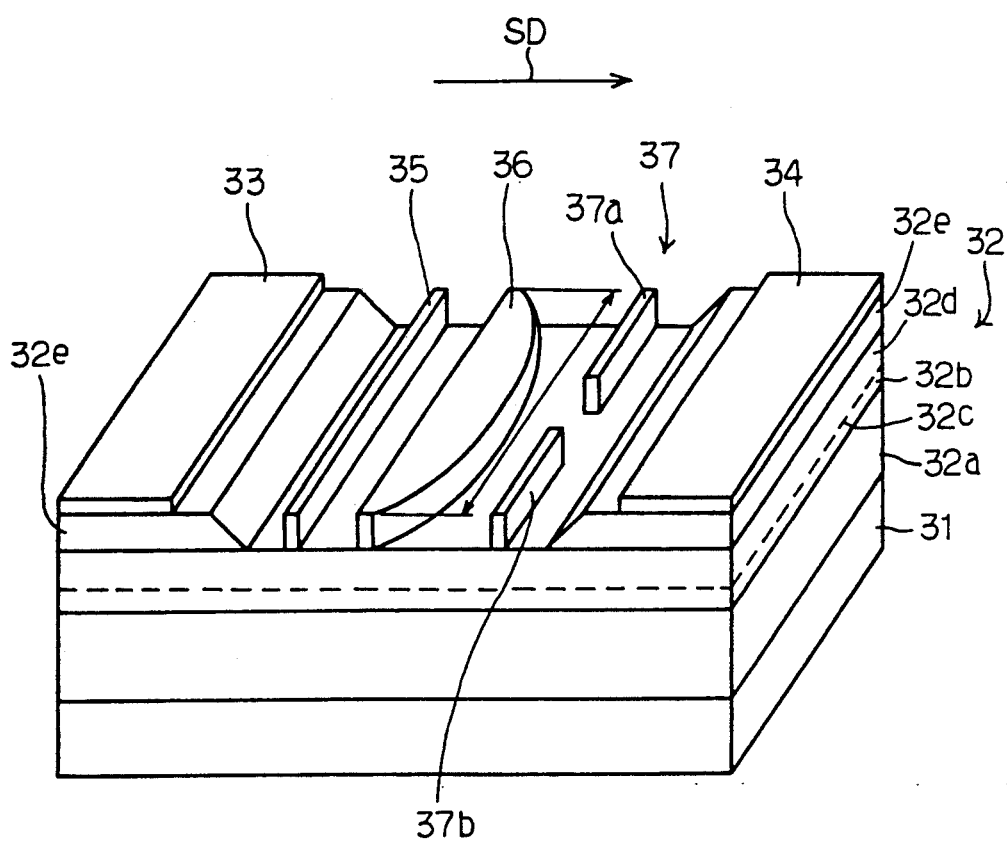
FIG. 7 is a perspective view showing the structure of another heterojunction field effect transistor with an electrostatic lens according to the present invention.

Turning to FIG. 7 of the drawings, another heterojunction field effect transistor embodying the present invention is illustrated. The heterojunction field effect transistor implementing the second embodiment is fabricated on a semi-insulating substrate 31 of gallium arsenide, and an epitaxial structure 32 is grown on the arsenide, and an epitaxial structure 32 is grown on the semi-insulating substrate 31. The epitaxial structure 32 comprises a channel forming layer 32a of intentionally undoped gallium arsenide as thin as about 2000 angstroms, a lower intentionally undoped aluminum gallium arsenide film 32b ($Al_{0.3}Ga_{0.7}As$) of about 500 angstroms, a silicon film 32c substantially as thin as a single silicon atom, an upper intentionally undoped aluminum gallium arsenide film 32d ($Al_{0.3}Ga_{0.7}As$) of about 200 angstroms, and a cap layer 32e of n-type gallium arsenide as thin as about 500 angstroms. The intentionally undoped aluminum gallium arsenide films 32b and 32d and the silicon film 32c as a whole constitute a carrier supplying structure. The silicon film 32c has a sheet density of about $5 \times 10^{12}/cm^2$, and the n-type gallium arsenide cap layer 32e is doped at about $5 \times 10^{18}/cm^3$. The channel forming layer 32a of intentionally undoped gallium arsenide provides the mean free path of electrons of about 10 microns.

A recess is formed in the cap layer 32e, and source and drain electrodes 33 and 34 are formed on the cap layer 32e on both sides of the recess. In a fabrication process, metal is evaporated so as to form a metal film, and the metal film is patterned by using a lithographic process. The patterned metal strips are alloyed so that ohmic contacts are formed between the source and drain electrodes 33 and 34 and the cap layer 32e. The recess formed in the cap layer 32e exposes the upper intentionally undoped aluminum gallium arsenide film 32d, and an emitter gate electrode 35, a focusing gate electrode 36 and a detecting gate electrode 37 are formed at spacing by using electron beam lithography. Schottky barriers are provided between the gate electrodes 35 to 37 and the upper intentionally undoped aluminum gallium arsenide film 32d.

The emitter gate electrode 35 and the detecting gate electrode 37 measure about 500 angstroms and about 0.1 micron in a source-to-drain direction SD along which the source and drain electrodes 33 and 34 are spaced apart. The side surfaces of the emitter gate electrode 35 and the detecting gate electrode 37 are substantially perpendicular to the source-to-drain direction SD. One of the side surfaces of the focusing gate electrode 36 is flat and substantially in parallel to the side surfaces of the emitter gate electrode 35. However, the other side surface of the focusing gate electrode 36 is of a convex surface, and has a radius of curvature of about 10 microns. The detecting gate electrode 37 is split into two halves 37a and 37b spaced apart from each other by about 0.2 micron, and the center axis of the gap between the two halves 37a and 37b is substantially aligned with an axis of symmetry of the curved side surface of the focusing gate electrode 36. The detecting gate electrode 37 is spaced from the focusing gate electrode 36 along the axis of symmetry by about 2 microns, and the emitter gate electrode 35 and the detecting gate electrode 37 are spaced apart by about 3 microns. Therefore, the distance between the emitter gate electrode 35 and the detecting gate electrode 37 is not greater than the mean free path of electrons in the channel forming layer 32a, and, for this reason, hot electrons ballistically travel from the emitter gate electrode 35 and the detecting gate electrode 37.

If an appropriate biasing voltage level is applied to the focusing gate electrode 36, the appropriate biasing voltage lowers the bottom edge of the conduction band in a region of the channel forming layer 32a below the focusing gate electrode. Electrons passing injected into the region below the focusing gate electrode 36 are accelerated with kinetic energy in a direction perpendicular to the interface therebetween. The region with the lowered bottom edge is referred to as a high kinetic energy region, and the other channel forming layer is called a low kinetic energy region. The high kinetic energy region behaves as greater than unity, and the low kinetic energy region has n greater than unity, and the low kinetic energy region has n = 1. Then, an electrostatic lens with an index of electron refraction n is produced below the focusing gate electrode 36, and the focal distance f of a convex lens is given by Equation 7.

$$f = \frac{r}{n-1} \quad \text{Equation 7}$$

If the biasing voltage level Vfg applied to the focusing gate electrode 36 is changed, the biasing voltage level Vfg varies the kinetic energy $E_2$ of electrons in the channel forming region below the focusing gate electrode 36, and the index of electron refraction is also varied as described in Equation 4. In other words, the focal distance f is variable with the biasing gate voltage Vfg, and differential negative resistance characteristics are observed between the drain current Id and the biasing voltage level Vfg.

If a modulation doped structure is employed, a heterojunction field effect transistor according to the present invention has an effective channel width of the order of 100 microns, and a large amount of drain current is controlled with the biasing voltage level Vfg.

Although particular embodiments of the present invention have been shown and described, it will be obvious to those skilled in the art that various changes and modifications may be made without departing from the spirit and scope of the present invention. For example, an epitaxial structure may be formed in AlGaAs/InGaAs system or in AlInAs/GaInAs system. Moreover, a focusing gate electrode may have convex side surfaces or concave side surfaces.

What is claimed is:

1. A heterojunction field effect transistor fabricated on a semi-insulating substrate, comprising:
   a) an epitaxial structure having a channel forming layer of a first compound semiconductor material and a carrier supplying layer of a second compound semiconductor material;
   b) source and drain electrodes provided on said epitaxial structure at spacing, and held in contact with said epitaxial structure in an ohmic manner;
   c) a focusing gate electrode formed on said epitaxial structure between said source and drain electrodes, and operative to form an electrostatic lens in said channel forming layer, a focal distance of said electrostatic lens being variable depending upon a biasing voltage level at said focusing gate electrode;
   d) an emitter gate electrode formed on said epitaxial structure between said source electrode and said focusing gate electrode, and operative to produce an abrupt potential discontinuity in the bottom edge of the conduction band of said first compound semiconductor material for producing hot carriers; and
   e) a detecting gate electrode formed on said epitaxial structure between said focusing gate electrode and said drain electrode, and spaced apart from said emitter gate electrode by a predetermined distance equal to or less than a mean free path of carriers in said channel forming layer, the amount of said carriers passing through said detecting gate electrode to said drain electrode being varied depending upon said focal distance.

2. A heterojunction field effect transistor as set forth in claim 1, in which said channel forming layer is formed by an intentionally undoped gallium arsenide film.

3. A heterojunction field effect transistor as set forth in claim 2, in which said intentionally undoped gallium arsenide film is about 2000 angstroms in thickness.

4. A heterojunction field effect transistor as set forth in claim 2, in which said epitaxial structure further has a spacer layer of intentionally undoped aluminum gallium arsenide sandwiched between said channel forming layer and said carrier supplying layer.

5. A heterojunction field effect transistor as set forth in claim 4, in which said spacer layer is about 500 angstroms in thickness.

6. A heterojunction field effect transistor as set forth in claim 4, in which said intentionally undoped aluminum gallium arsenide is expressed by the molecular formula of $Al_{0.2}Ga_{0.8}As$.

7. A heterojunction field effect transistor as set forth in claim 4, in which said carrier supplying layer is formed of n-type aluminum gallium arsenide.

8. A heterojunction field effect transistor as set forth in claim 7, in which said n-type aluminum gallium arsenide is expressed by the molecular formula of $Al_{0.2}Ga_{0.8}As$.

9. A heterojunction field effect transistor as set forth in claim 8, in which said n-type aluminum gallium arsenide is doped at about $3\times10^{18}/cm^3$.

10. A heterojunction field effect transistor as set forth in claim 9, in which said carrier supplying layer is about 300 angstroms in thickness.

11. A heterojunction field effect transistor as set forth in claim 7, in which said epitaxial structure further has a cap layer of heavily doped n-type gallium arsenide grown on said carrier supplying layer, and in which said cap layer is implemented by a pair of strips spaced apart from each other with which said source and drain electrodes are respectively held in contact in an ohmic manner.

12. A heterojunction field effect transistor as set forth in claim 11, in which said cap layer is doped at about $5\times10^{18}/cm^3$.

13. A heterojunction field effect transistor as set forth in claim 12, in which said cap layer is about 300 angstroms in thickness.

14. A heterojunction field effect transistor as set forth in claim 11, in which said focusing gate electrode, said emitter gate electrode and said detecting gate electrode provide respective Schottky barriers against said n-type aluminum gallium arsenide.

15. A heterojunction field effect transistor as set forth in claim 14, in which said focusing gate electrode has a first flat side surface facing to said emitter gate electrode and substantially perpendicular to a source-to-drain direction along which said source and drain electrodes are spaced apart, and in which said focusing gate electrode further has a second concave side surface faced to said detecting gate electrode and having a predetermined radius of curvature and an axis of symmetry substantially parallel to said source-to-drain direction.

16. A heterojunction field effect transistor as set forth in claim 15, in which said emitter gate electrode has side surfaces substantially parallel to said first flat side surface.

17. A heterojunction field effect transistor as set forth in claim 16, in which said detecting gate electrode is split into two halves spaced apart from each other for forming a gap therebetween, and in which said gap is located on said axis of symmetry.

18. A heterojunction field effect transistor as set forth in claim 17, in which said two halves produce a potential barrier against said hot carriers in said channel forming layer therebelow.

19. A heterojunction field effect transistor as set forth in claim 14, in which said focusing gate electrode has a first flat side surface facing to said emitter gate electrode and substantially perpendicular to a source-to-drain direction along which said source and drain electrodes are spaced apart, and in which said focusing gate electrode further has a second convex side surface faced to said detecting gate electrode and having a predetermined radius of curvature and an axis of symmetry substantially parallel to said source-to-drain first direction.

20. A heterojunction field effect transistor as set forth in claim 19, in which said emitter gate electrode has side surfaces substantially parallel to said first flat side surface.

21. A heterojunction field effect transistor as set forth in claim 20, in which said detecting gate electrode is split into two halves spaced apart from each other for forming a gap therebetween, and in which said gap is located on said axis of symmetry.

22. A heterojunction field effect transistor as set forth in claim 21, in which said two halves produce a potential barrier against said hot carriers in said channel forming layer therebelow.

23. A heterojunction field effect transistor fabricated on a semi-insulating substrate of gallium arsenide, comprising:

a) a channel forming layer of intentionally undoped gallium arsenide grown on said semi-insulating substrate;

b) a spacer layer of intentionally undoped aluminum gallium arsenide grown on said channel forming layer;

c) an electron supplying layer of n-type aluminum gallium arsenide grown on said spacer layer;

d) a cap layer of heavily doped n-type gallium arsenide grown on said electron supplying layer, and partially removed so as to expose said electron supplying layer;

e) source and drain electrodes formed on said cap layer on both sides of an exposed surface of said electron supplying layer, and regulated in such a manner that said drain electrode is positively biased with respect to said source electrode, said source and drain electrodes forming ohmic contacts to said heavily doped n-type gallium arsenide;

f) a focusing gate electrode formed on said exposed surface, and forming a Schottky barrier against said n-type aluminum gallium arsenide, said focusing gate electrode varying a kinetic energy in a first region of said channel forming layer therebelow in the presence of a first biasing voltage level applied thereto for forming an electrostatic lens with a predetermined focal distance;

g) an emitter gate electrode formed on said exposed surface between said source electrode and said focusing gate electrode, and forming a Schottky barrier against said n-type aluminum gallium arsenide, said emitter gate electrode being operative to deplete a second region of said channel forming layer therebelow in the presence of a second predetermined biasing voltage level applied thereto for producing an abrupt potential discontinuity in the bottom edge of the conduction band at an interface between said second region and a third region of said channel forming layer between said first and second regions, said abrupt potential discontinuity accelerating electrons supplied from said source electrode for producing hot electrons; and h) a detecting gate electrode formed on said exposed surface between said focusing gate electrode and said drain electrode, and forming a Schottky barrier against said n-type aluminum gallium arsenide, said detecting gate electrode being spaced apart from said emitter gate electrode by a predetermined distance equal to or less than a mean free path of electron in said intentionally undoped gallium arsenide, said detecting gate electrode being split into two halves for forming a gap therebetween, said focusing gate electrode having a concave side surface with a predetermined radius of curvature faced to said detecting gate electrode, said concave side surface having an axis of symmetry substantially parallel to a direction between said source and drain electrodes, said gap being located on said axis of symmetry, a fourth region of said channel forming layer below said gap being spaced apart from said first region by a predetermined distance approximately equal to said predetermined focal distance for allowing said hot electrons to flow into said drain electrode in the presence of a third biasing voltage level at said detecting gate electrode producing a potential barrier against said hot electrons in a fifth region of said channel forming layer therebelow.

24. A heterojunction field effect transistor fabricated on a semi-insulating substrate of gallium arsenide, comprising:

a) a channel forming layer of intentionally undoped gallium arsenide grown on said semi-insulating substrate;

b) a spacer layer of intentionally undoped aluminum gallium arsenide grown on said channel forming layer;

c) an electron supplying structure grown on said spacer layer, and having a silicon film sandwiched between intentionally undoped aluminum gallium arsenide films;

d) a cap layer of heavily doped n-type gallium arsenide grown on said electron supplying structure, and partially removed so as to expose said electron supplying structure;

e) source and drain electrodes formed on said cap layer on both sides of an exposed surface of said electron supplying structure, and regulated in such a manner that said drain electrode is positively biased with respect to said source electrode, said source and drain electrodes forming ohmic contacts to said n-type gallium arsenide;

f) a focusing gate electrode formed on said exposed, surface, and forming a Schottky barrier against said intentionally undoped aluminum gallium arsenide, said focusing gate electrode varying a kinetic energy in a first region of said channel forming layer there below in the presence of a first biasing voltage level applied thereto for forming an electrostatic lens with a predetermined focal distance;

g) an emitter gate electrode formed on said exposed surface between said source electrode and said focusing gate electrode, and forming a Schottky barrier against said intentionally undoped aluminum gallium arsenide, said emitter gate electrode being operative to deplete a second region of said channel forming layer therebelow in the presence of a second predetermined biasing voltage level applied thereto for producing an abrupt potential discontinuity in the bottom edge of the conduction band at an interface between said second region and a third region of said channel forming layer between said first and second regions, said abrupt potential discontinuity accelerating electrons supplied from said source electrode for producing hot electrons; and h) a detecting gate electrode formed on said exposed surface between said focusing gate electrode and said drain electrode, and forming a Schottky barrier against said intentionally undoped aluminum gallium arsenide, said detecting gate electrode being spaced apart from said emitter gate electrode by a predetermined distance equal to or less than a mean free path of electrons in said intentionally undoped gallium arsenide, said detecting gate electrode being split into two halves for forming a gap therebetween, said focusing gate electrode having a convex side surface with a predetermined radius of curvature faced to said detecting gate electrode, said convex side surface having an axis of symmetry substantially parallel to a direction between said source and drain electrodes, said gap being located on said axis of symmetry, a fourth region of said channel forming layer below said gap being spaced apart from said first region by a predetermined distance approximately equal to said predetermined focal distance for allowing said hot electrons to flow into said drain electrode in the presence of a third biasing voltage level at said detecting gate electrode producing a potential barrier against said hot electrons in a fifth region of said channel forming layer therebelow.

* * * * *